US008891246B2

(12) United States Patent  
Guzek et al.

(10) Patent No.: US 8,891,246 B2  
(45) Date of Patent: Nov. 18, 2014

(54) SYSTEM-IN-PACKAGE USING EMBEDDED-DIE CORELESS SUBSTRATES, AND PROCESSES OF FORMING SAME

(75) Inventors: John S. Guzek, Chandler, AZ (US); Vijay K. Nair, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 590 days.

(21) Appl. No.: 12/725,925

(22) Filed: Mar. 17, 2010

(65) Prior Publication Data  
US 2011/0228464 A1 Sep. 22, 2011

(51) Int. Cl.  
*H05K 1/16* (2006.01)  
*H01L 23/538* (2006.01)  
*H01L 23/498* (2006.01)  
*H01L 23/00* (2006.01)

(52) U.S. Cl.  
CPC ... *H01L 23/5389* (2013.01); *H01L 2924/15311* (2013.01); *H01L 2224/16* (2013.01); *H01L 2224/48227* (2013.01); *H01L 2924/3025* (2013.01); *H01L 23/49816* (2013.01); *H01L 2924/19041* (2013.01); *H01L 23/49822* (2013.01); *H01L 24/48* (2013.01); *H01L 2224/48091* (2013.01); *H01L 2924/01057* (2013.01)  
USPC ........... 361/766; 361/707; 361/709; 361/763; 361/790; 361/795

(58) Field of Classification Search  
USPC ........... 361/763–795, 704–710; 257/690–692  
See application file for complete search history.

(56) References Cited

U.S. PATENT DOCUMENTS

| | | | |
|---|---|---|---|
| 6,757,178 B2 * | 6/2004 | Okabe et al. .................. 361/793 |
| 7,515,879 B2 * | 4/2009 | Okabe et al. .................... 455/73 |
| 8,110,920 B2 * | 2/2012 | Dattaguru et al. ............. 257/724 |
| 2004/0164390 A1 | 8/2004 | Wang |
| 2004/0173849 A1 | 9/2004 | Yamazaki et al. |
| 2006/0124347 A1 | 6/2006 | Takaike |
| 2006/0133056 A1 * | 6/2006 | Wyrzykowska et al. ...... 361/763 |
| 2007/0035013 A1 | 2/2007 | Handa et al. |
| 2007/0069352 A1 | 3/2007 | Ho et al. |
| 2007/0080439 A1 | 4/2007 | Kikuchi et al. |
| 2007/0096292 A1 * | 5/2007 | Machida ........................ 257/700 |
| 2007/0120245 A1 * | 5/2007 | Yoshikawa et al. ........... 257/691 |
| 2007/0242440 A1 * | 10/2007 | Sugaya et al. ................. 361/762 |
| 2007/0289127 A1 * | 12/2007 | Hurwitz et al. .................. 29/827 |

(Continued)

FOREIGN PATENT DOCUMENTS

| | | | |
|---|---|---|---|
| WO | 2009/042463 A1 | 4/2009 |
| WO | 2011/116106 A2 | 9/2011 |
| WO | 2011/116106 A3 | 1/2012 |

OTHER PUBLICATIONS

International Search Report and Written Opinion received for PCT Patent Application No. PCT/US2011/028689, mailed on Nov. 16, 2011, 12 pages.

(Continued)

*Primary Examiner* — Tuan T Dinh  
(74) *Attorney, Agent, or Firm* — Winkle, PLLC

(57) ABSTRACT

An apparatus includes a coreless substrate with an embedded die that is integral to the coreless substrate, and at least one device assembled on a surface that is opposite to a ball-grid array disposed on the coreless substrate. The apparatus may include an over-mold layer to protect the at least one device assembled on the surface.

34 Claims, 8 Drawing Sheets

(56) References Cited

U.S. PATENT DOCUMENTS

2009/0121335 A1  5/2009  Camacho et al.
2009/0213526 A1* 8/2009  Hsu et al. .................. 361/306.1
2009/0236031 A1  9/2009  Sunohara et al.
2009/0283889 A1  11/2009 Jang et al.

OTHER PUBLICATIONS

International Preliminary Report on Patentability Received for PCT Patent Application No. PCT/US2011/028689, Mailed on Sep. 27, 2012, 9 pages.

Office Action received for Korean Patent Application No. 2012-7024016, mailed on Oct. 28, 2013, 6 Pages of English Translation only.

Extended European Search Report received for EP Patent Application No. 11756940.0, mailed on Nov. 25, 2013, 10 pages.

Supplementary European Search Report received for EP Patent Application No. 11756940.0, mailed on Dec. 12, 2013, 1 page.

Notice of Allowance received for Korean Patent Application No. 2012-7024016, mailed on Feb. 26, 2014, 1 page of English Translation and 2 pages of NOA.

* cited by examiner

SYSTEM-IN-PACKAGE USING EMBEDDED-DIE CORELESS SUBSTRATES, AND PROCESSES OF FORMING SAME

BACKGROUND

Disclosed embodiments relate to semiconductor microelectronic devices and processes of packaging them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1A:
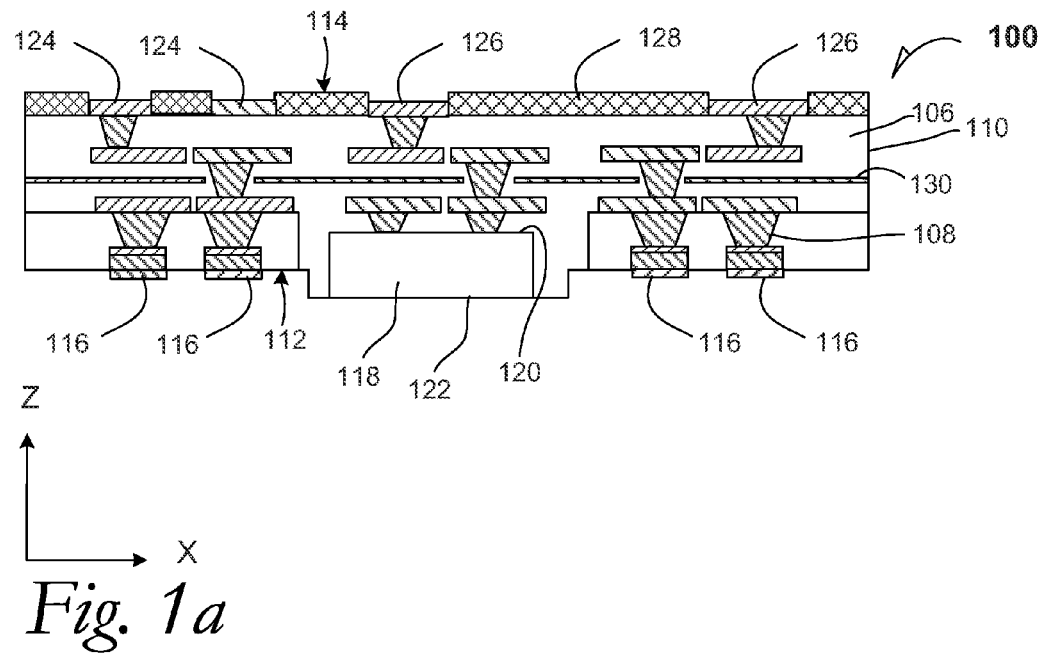
FIG. 1a is a cross-section elevation of an embedded-die coreless-substrate apparatus according to an example embodiment.

FIG. 1a is a cross-section elevation of an embedded-die coreless-substrate apparatus 100 according to an example embodiment. A coreless substrate 110 includes a land side 112 and a device-mounting side 114. The land side 112 may also be referred to as a first surface 112 of the coreless substrate 110. The device-mounting side 114 may also be referred to as a second surface 114 of the coreless substrate 110. The coreless substrate is represented in simplified form with interlayer dielectric materials 106 and metallizations 108. The metallizations 108 communicate between the land side 112 and the device-mounting side 114. The metallizations 108 are depicted in simplified form for illustrative purposes. It can be seen that the metallizations 108 and the embedded die 118 are part of a bumpless build-up layer (BBUL) package. Consequently, the apparatus 100 may be referred to as a BBUL coreless (BBUL-C) package.

A ball-grid pad array is located on the land side 112. A plurality of four ball pads 116 is illustrated on the first surface 112, but the number is small for illustrative simplicity. An embedded die 118 is illustrated such that it is integral to the coreless substrate 110. The embedded die 118 includes an active surface 120 and a backside surface 122. The backside surface 122 is exposed through the first surface 112. Several contact pads are illustrated on the device-mounting side 114. In the illustrated embodiment, two flip-chip pads 124 and two wire-bond pads 126 are configured at the second surface 114 through a solder mask 128. It may be understood the several contact pads is merely illustrative and several more than four may be disposed on the second surface 114 even in the cross-section view depicted.

On the first surface, four ball pads 116 are illustrated for simplicity, but it is understood that several more ball pads may be disposed along the X-direction (and along the Y-direction, which is orthogonal to the plane of the FIG.) when ball pitch is spaced on uniform centers. For example where the cross section illustrated intersects the coreless substrate 110 at the embedded die 118, the four ball pads 116 are seen, but where the cross-section might intersect the coreless substrate 110 and not the embedded die such as at an edge of the coreless substrate, more ball pads would be intersected. In an embodiment, a ball-pad number along an edge is in a range from 200 to 700.

In an embodiment, a metal shielding plane 130 is provided and it is illustrated in simplified form for clarity. The metal shielding plane 130 is provided to act as a shielding structure to assist in sequestering local electromagnetic (EM) noise to areas that remain near the source of the noise. For example the metal shielding plane 130 may cause EM noise generated at the embedded die 118 to remain below the metal plane 130 such that signals communicating to devices disposed on the second surface 114 may be less affected by the EM noise emanating from the embedded die 118.

It may now be understood that shielding such as the metal shielding plane 130 may be placed at several locations along the Z-direction to sequester EM noise that may be generated within the metallizations 108. In an embodiment, shielding may be achieved by partial placements along the X-direction according to specific needs. For example, the metal shielding plane 130 may only traverse a portion of the X-direction. As shown in FIG. 1a, the metallizations 108 may extend through the metal shielding plane 130 without contacting the metal shielding plane 130.

Manufacture of the embedded-die coreless-substrate apparatus 100 may be done by a BBUL-C process. In a BBUL-C process embodiment, the embedded die 118 is first seated with the backside surface 122 in a material such as a cavity-containing copper foil, and a build-up layer is manufactured that includes coupling the metallizations 108 to the active surface 120, and followed by removing the material to expose the backside surface 122 as illustrated. An embedded-die BBUL-C embodiment results.

Figure 1B:
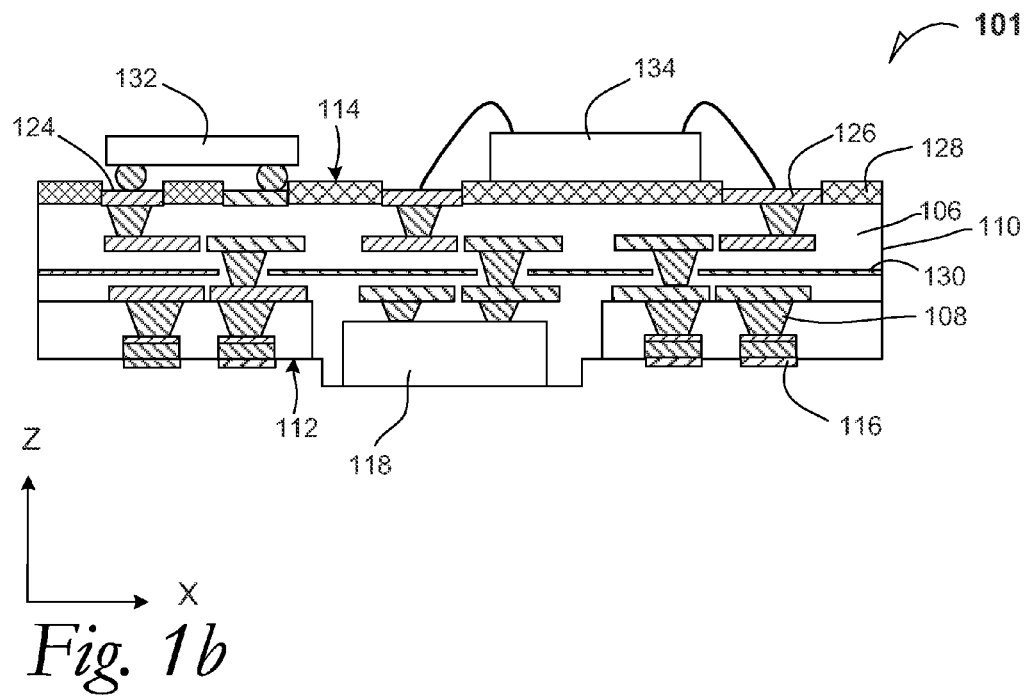
FIG. 1b is a cross-section elevation of the apparatus depicted in FIG. 1a after further processing according to an embodiment.

FIG. 1b is a cross-section elevation of the apparatus depicted in FIG. 1a after further processing according to an embodiment. The apparatus 101 has been processed to include at least one device disposed on the second surface 114. In an embodiment, a first device 132 is a memory chip 132 that has been flip-chip mounted on the second surface 114. In an embodiment, a subsequent device 134 is a radio-frequency (RF) chip 134 has been wire-bonded on the second surface 114. It can be seen that the subsequent chip 134 is disposed upon the solder mask 128, but it may be set upon other structures such as a heat sink that would be immediately below the subsequent chip 134 without shorting into the metallization. It may now be understood that multiple RF dice devices may be either-wire mounted or flip-chip mounted on the second surface. Even though the FIG. 1b shows only one RF die that is wire bonded, it may now be understood that multiple RF device can be mounted on the second surface by either or both of wire-bond or flip-chip techniques.

Figure 1C:
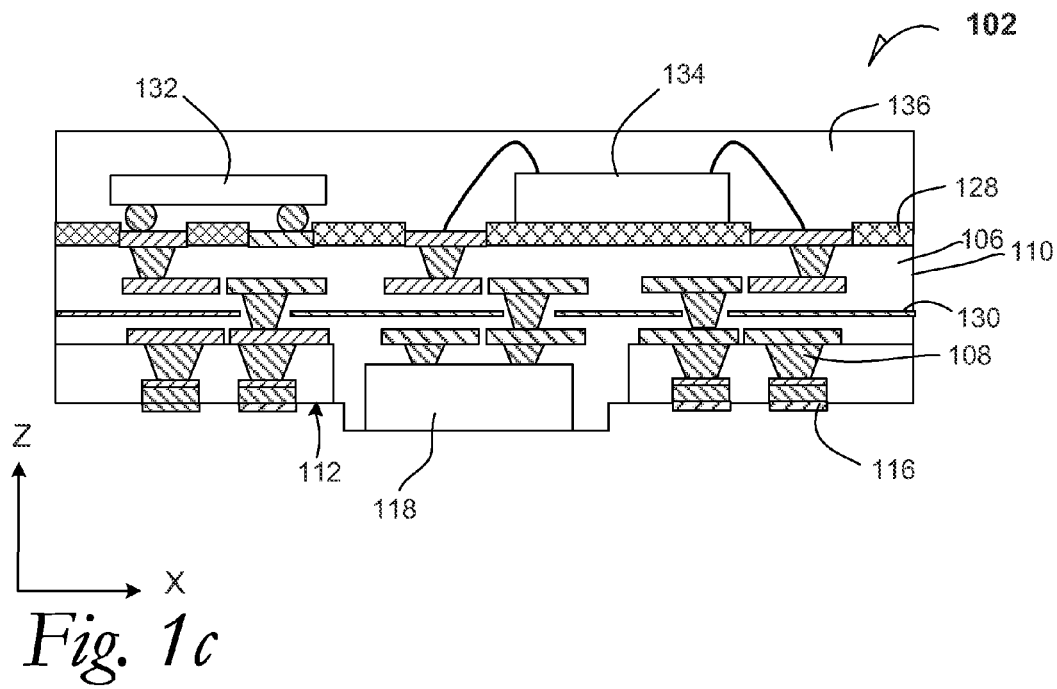
FIG. 1c is a cross-section elevation of the apparatus depicted in FIG. 1b after further processing according to an embodiment.

FIG. 1c is a cross-section elevation of the apparatus depicted in FIG. 1b after further processing according to an embodiment. The apparatus 102 has been further processed to include an overmold layer 136 that protects the at least one device disposed on the second surface 114. The overmold layer 136 delivers multiple effects including at least protection of the at least one device and providing additional stiffness to the entire apparatus 102.

Figure 1D:
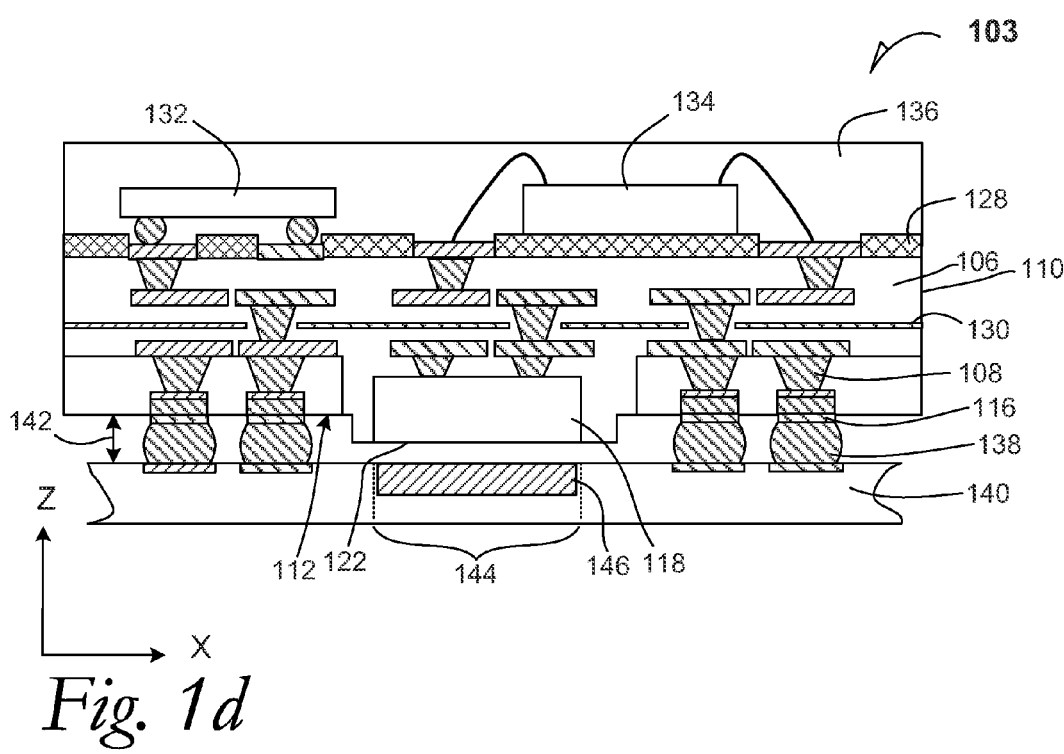
FIG. 1d is a cross-section elevation of the apparatus depicted in FIG. 1c after further processing according to an embodiment.

FIG. 1d is a cross-section elevation of the apparatus depicted in FIG. 1c after further processing according to an embodiment. The apparatus 103 has been further processed to include a plurality of electrical bumps 138 disposed on the ball-grid pad array that is illustrated with the ball pads 116.

The apparatus 103 has been further processed according to an embodiment, to be mounted upon a substrate 140 such as a board for a smart phone or a hand-held electronic device. The substrate 140 may be referred to as a foundation substrate 140 that accepts an embedded-die BBUL-C substrate 110. The land side 112 thus faces the substrate 140. In an embodiment, the electrical bumps 138 are sized to create a standoff 142 such that the embedded die 118 has sufficient clearance so as not to contact the substrate 140. The standoff 142 allows for useful, high-volume production without significant yield loss.

In an embodiment, the standoff 142 allows the backside 122 of the embedded die 118 to seat onto the substrate 140 (not illustrated) such that additional integral stiffness is achieved. In a process embodiment, the electrical bumps 138 are reflowed to allow the backside 122 to seat onto a die-footprint 144 of the substrate 140, but a given standoff 142 is maintained by holding a jig (not pictured) during reflow of the electrical bumps 138. The jig defines the standoff 142 after reflow. Consequently, the backside 122 may be seated onto the die-footprint 144. In an embodiment, the die-footprint 144 includes a heat sink 146 that is embedded in the substrate 140 and may be defined by the size of the embedded die 118. Consequently, a useful standoff 142 is created that allows the backside 122 to seat itself onto the substrate 140 at a heat sink 146.

The embedded-die coreless embodiment illustrated provides a high-density interconnect (HDI) design that results in a system-in-package (SiP) embodiment. In an example embodiment, the apparatus is a smart phone 103 with most of the processing power assigned to the embedded die 118, most of the memory caching function assigned to the flip-chip 132, and most of the RF duty assigned to the wire-bond chip 134 An example embodiment of HDI design rules includes line/spaces that are in a range from 10 μm to less than 20 μm. An example embodiment of HDI design rules includes via sizes that are in a range from 30 μm to less than 60 μm. An example embodiment of HDI design rules includes die interconnect pitches that are in a range from 100 μm to less than 200 μm.

Figure 2:
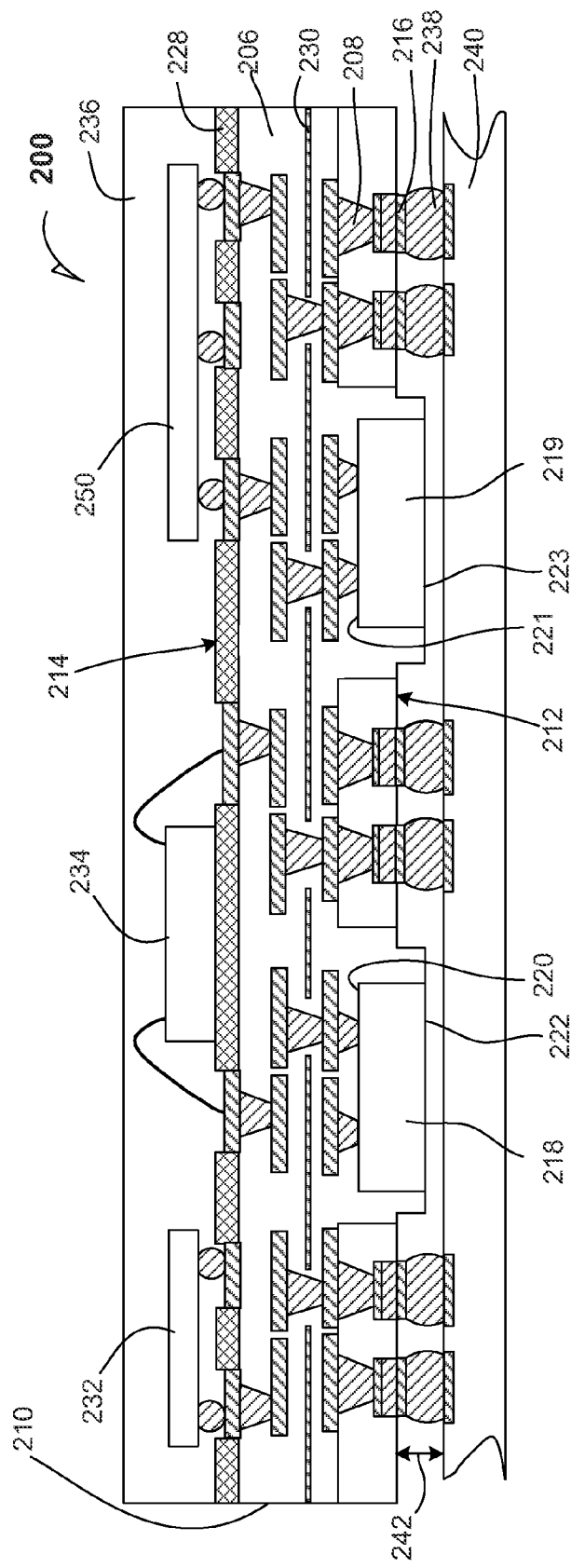
FIG. 2 is a cross-section elevation of an embedded-die coreless-substrate apparatus according to an example embodiment.

FIG. 2 is a cross-section elevation of an embedded-die coreless-substrate apparatus 200 according to an example embodiment. A coreless substrate 210 includes a land side 212 and a device-mounting side 214. The land side 212 may also be referred to as a first surface 212 of the coreless substrate 210 and the device-mounting side 214 may also be referred to as a second surface 214 of the coreless substrate 210. An embedded first die 218 and an embedded subsequent die 219 are depicted integral to the coreless substrate 210.

The embedded first die 218 is illustrated such that it is integral to the coreless substrate 210 as well as the embedded subsequent die 219. Each embedded die includes an active surface 220 and 221 and a backside surface 222 and 223, respectively. In each case, the respective backside surfaces 222 and 223 are exposed through the first surface 212.

Metallizations 208 communicate between the land side 212 and the device-mounting side 214. The metallizations 208 are depicted in simplified form for illustrative purposes. It can be seen that the metallizations 208 and the embedded dice 218 and 219 are part of a BBUL-C package. Manufacture of the embedded-die coreless-substrate apparatus 200 may be done by a BBUL-C process.

A ball-grid pad array is located on the land side 212 and a plurality of six ball pads 216 is illustrated on the first surface 212. Several contact pads are illustrated on the device-mounting side 214. In the illustrated embodiment, flip-chip pads and wire-bond pads are configured at the second surface 214 through a solder mask 228.

In an embodiment, a metal shielding plane 230 is provided and it is illustrated in simplified form for clarity. The metal shielding 230 is provided to act as a shielding structure to assist in sequestering local electromagnetic (EM) noise to areas that remain near the source of the noise. It may now be understood that shielding such as the metal shielding plane 230 may be placed at several locations along the Z-direction to sequester EM noise that may be generated within the metallizations 208. In an embodiment, shielding may be achieved by partial placements along the X-direction according to specific needs. For example, the metal shielding plane 230 may only traverse a portion of the X-direction. As shown in FIG. 2, the metallizations 208 may extend through the metal shielding plane 230 without contacting the metal shielding plane 230.

The apparatus 200 also has an overmold layer 236 that protects the at least one device disposed on the second surface 214. The overmold layer 236 delivers multiple effects including at least protection of the at least one device and providing additional stiffness to the entire apparatus 200.

The apparatus 200 has also been processed to include a plurality of electrical bumps 238 disposed on the ball-grid pad array that is illustrated with the ball pads 216.

In an embodiment, the apparatus 200 has also been assembled to a substrate 240 such as a board for a smart phone or a hand-held electronic device. The substrate 240 may be referred to as a foundation substrate 240 that accepts a BBUL-C substrate 210. The land side 212 thus faces the substrate 240. In an embodiment, the electrical bumps 238 are sized to create a standoff 242 such that the embedded dice 218 and 219 have sufficient clearance so as not to contact the substrate 240. The standoff 242 allows for useful, high-volume production without significant yield loss.

In an embodiment, the standoff 242 allows at least one backside 222 or 223 of the embedded die 218 or the embedded die 219 to seat onto the substrate 240 (not illustrated) such that additional integral stiffness is achieved.

The embedded-dice coreless embodiment illustrated provides a HDI design that results in an SiP embodiment. In a example embodiment, the apparatus is a smart phone 200 with most of the processing power assigned to the embedded first die 218. Where the memory caching function may be assigned to the flip-chip 232, and most of the RF duty assigned to the wire-bond chip 234, the subsequent device 250 may be a memory chip that communicates with the embedded subsequent die 219.

Figure 3:
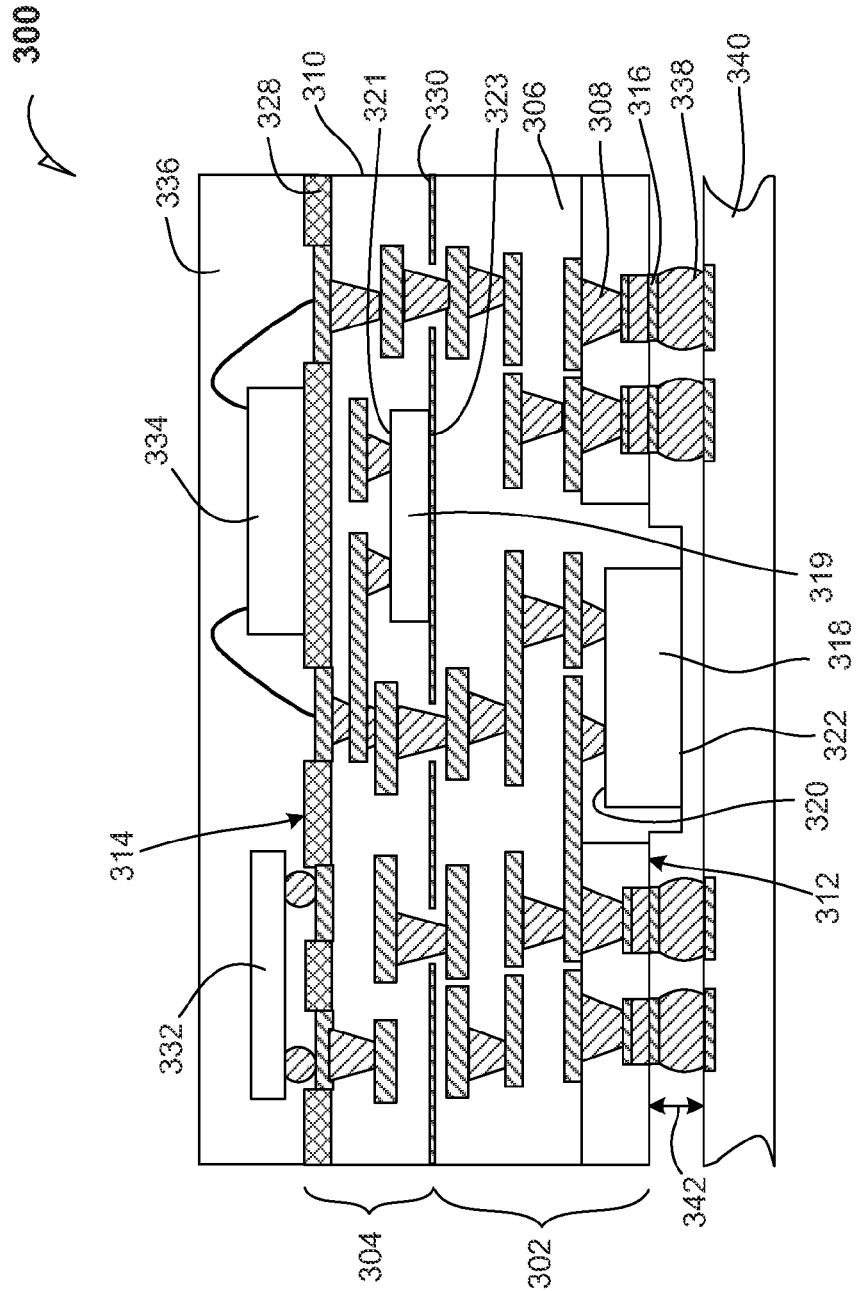
FIG. 3 is a cross-section elevation of an embedded-die coreless-substrate apparatus according to an example embodiment.

FIG. 3 is a cross-section elevation of an embedded-die coreless-substrate apparatus 300 according to an example embodiment. A coreless substrate 310 includes a land side 312 and a device-mounting side 314. The land side 312 may also be referred to as a first surface 312 of the coreless substrate 310 and the device-mounting side 314 may also be referred to as a second surface 314 of the coreless substrate 310. An embedded first die 318 and an embedded subsequent die 319 are depicted integral to the coreless substrate 310. In an embodiment, the embedded first die 318 is located in a coreless first section 302 and the embedded subsequent die 319 is located in a coreless subsequent section 304 of the coreless substrate 310. The embedded first die 318 is illustrated such that it is integral to the coreless substrate 310 as well as the embedded subsequent die 319, but the embedded first die has an active surface 320 and a backside surface 322 that is exposed through the first surface 312. The embedded subsequent die 319 also has an active surface 321 and a backside surface 323.

Metallizations 308 communicate between the land side 312 and the device-mounting side 314. The metallizations 308 are depicted in simplified form for illustrative purposes. It can be seen that the metallizations 308 and the embedded dice 318 and 319 are part of a BBUL-C package. Manufacture of the embedded-die coreless-substrate apparatus 300 may be done by a BBUL-C process. In a process embodiment, the embedded first die 318 is assemble in the coreless first section 302 and the embedded subsequent die 319 is assembled in the coreless subsequent section 304 after which the coreless first section 302 and the coreless subsequent section 304 are assembled. Design rules are harmonized for conjoining of the coreless first section 302 and the coreless subsequent section 304 to allow the assembly to become of an embedded-dice coreless-substrate apparatus 300.

In an embodiment, the coreless first section 302 and the coreless subsequent section 304 are fabricated by BBUL-C processing that includes sequential placement of the dice 318 and 319 as a matter of course. For example in BBUL-C processing, the subsequent die 319 is first installed in a coreless intermediate structure and BBUL-C processing continues to form metallization and interlayer dielectric material, followed by installation of the first die 318, followed by inversion of the structure as depicted in FIG. 3

A ball-grid pad array is located on the land side 312 and a plurality ball pads 316 is illustrated on the first surface 312. Several contact pads are illustrated on the device-mounting side 314. In the illustrated embodiment, flip-chip pads and wire-bond pads are configured at the second surface 314 through a solder mask 328.

In an embodiment, an metal shielding plane 330 is provided and it is illustrated in simplified form for clarity. The metal shielding plane 330 is provided to act as a shielding structure to assist in sequestering local EM noise to areas that remain near the source of the noise. It may now be understood that shielding such as the metal shielding plane 330 may be placed at several locations along the Z-direction to sequester EM noise that may be generated within the metallizations 308. As illustrated and according to an embodiment, the metal shielding plane 330 acts as a backside metallization for the embedded subsequent die 319, as well as an EM shield. As shown in FIG. 3, the metallizations 308 may extend through the metal shielding plane 330 without contacting the metal shielding lane 330.

The apparatus 300 also has at least one device disposed on the second surface 314. In an embodiment, a first device 332 has been flip-chip mounted on the second surface 314. In an embodiment, a subsequent device 334 has been wire-bonded on the second surface 314. It can be seen that the subsequent device 334 is disposed upon the solder mask 328, but it may be set upon other structures such as a heat sink that would be located immediately below the subsequent device 334.

The apparatus 300 also has an overmold layer 336 that protects the at least one device disposed on the second surface 314. The overmold layer 336 delivers multiple effects including at least protection of the at least one device and providing additional stiffness to the entire apparatus 300.

The apparatus 300 has also been processed to include a plurality of electrical bumps 338 disposed on the ball-grid pad array that is illustrated with the ball pads 316.

In an embodiment, the apparatus 300 has also been assembled to a substrate 340 such as a board for a smart phone or a hand-held electronic device. The substrate 340 may be referred to as a foundation substrate 340 that accepts a BBU-C substrate. The land side 312 thus faces the substrate 340. In an embodiment, the electrical bumps 338 are sized to create a standoff 342 such that the embedded die 318 has sufficient clearance so as not to contact the substrate 340. The standoff 342 allows for useful, high-volume production without significant yield loss.

In an embodiment, the standoff 342 allows the backside 322 of the embedded die 318 to seat onto the substrate 340 (not illustrated) such that additional integral stiffness is achieved.

The embedded-dice coreless embodiment illustrated provides a HDI design that results in an SiP embodiment. In a example embodiment, the apparatus is a smart phone 300 with most of the processing power assigned to the embedded first die 318. Where the memory caching function may be assigned to the flip-chip 332. The embedded subsequent die 319 is located near (in the illustrated embodiment immediately below) the wire-bond chip 334, and the subsequent die 319 may be a memory chip that communicates with the wire-bond chip 334.

Figure 4:
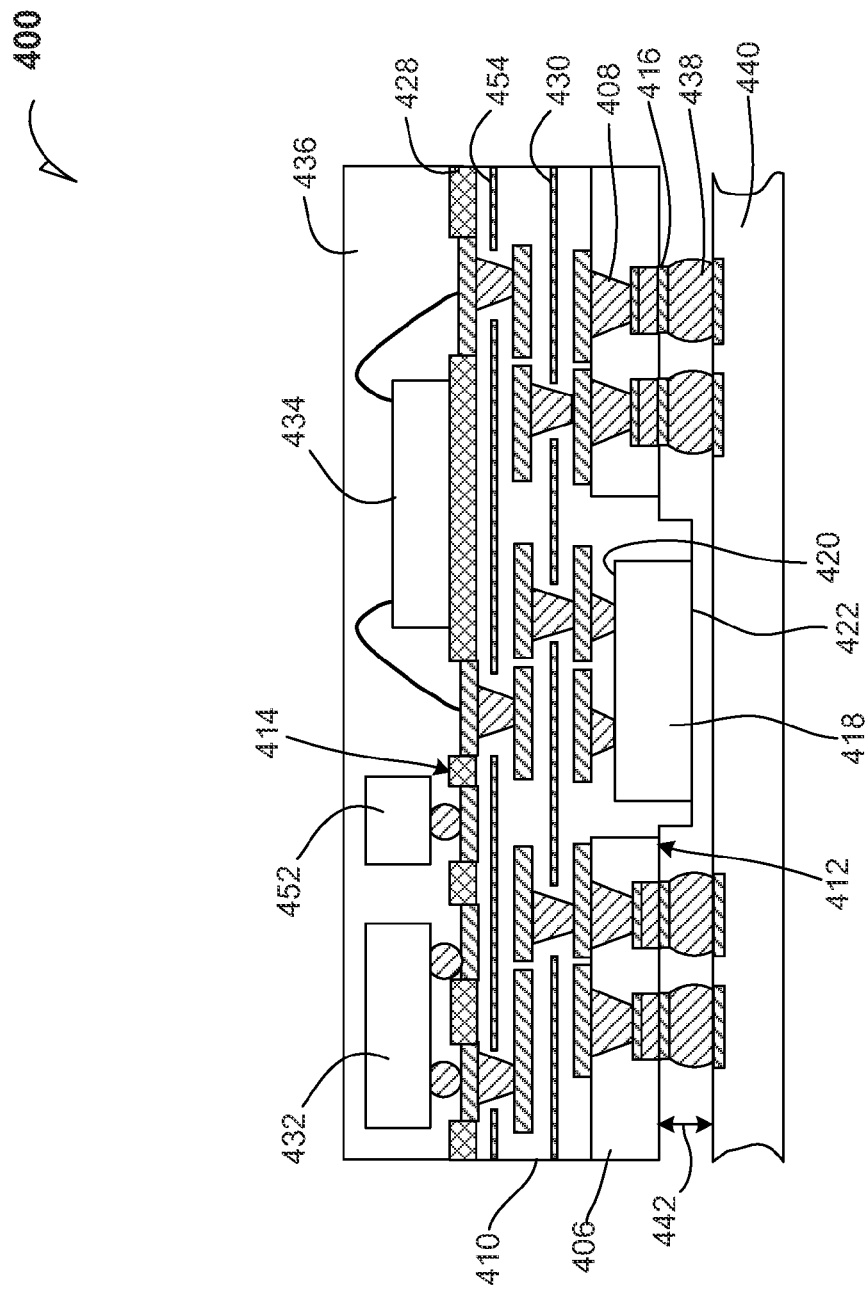
FIG. 4 is a cross-section elevation of an embedded-die coreless-substrate apparatus according to an example embodiment.

FIG. 4 is a cross-section elevation of an embedded-die coreless-substrate apparatus 400 according to an example embodiment. A coreless substrate 410 includes a land side 412 and a device-mounting side 414. The land side 412 may also be referred to as a first surface 412 of the coreless substrate 410 and the device-mounting side 414 may also be referred to as a second surface 414 of the coreless substrate 410. An embedded die 418 is depicted integral to the coreless substrate 410.

The embedded die 418 includes an active surface 420 and a backside surface 422. The backside surface 422 is exposed through the first surface 412.

Metallizations 408 communicate between the land side 412 and the device-mounting side 414. The metallizations 408 are depicted in simplified form for illustrative purposes. It can be seen that the metallizations 408 and the embedded die 418 are part of a BBUL-C package. Manufacture of the embedded-die coreless-substrate apparatus 400 may be done by a BBUL-C process.

A ball-grid pad array is located on the land side 412 and a plurality ball pads 416 is illustrated on the first surface 412. Several contact pads are illustrated on the device-mounting side 414. In the illustrated embodiment, flip-chip pads and wire-bond pads are configured at the second surface 414 through a solder mask 428.

In an embodiment, an metal shielding plane 430 is provided and it is illustrated in simplified form for clarity. The metal shielding plane 430 is provided to act as a shielding structure to assist in sequestering local EM noise to areas that remain near the source of the noise. It may now be understood that shielding such as the metal shielding plane 430 may be placed at several locations along the Z-direction to sequester EM noise that may be generated within the metallizations 408. In an embodiment, shielding may be achieved by partial placements along the X-direction according to specific needs. For example, the metal shielding plane 430 may only traverse a portion of the X-direction. As shown in FIG. 4, the metallizations 108 may extend through the metal shielding plane 130 without contacting the metal shielding plane 130.

The apparatus 400 also has at least one device disposed on the second surface 414. In an embodiment, a first device 432 has been flip-chip mounted on the second surface 414. In an embodiment, a second device 434 has been wire-bonded on the second surface 414. In a embodiment, a subsequent device 452 has been flip-chip mounted on the second surface 414. In an embodiment, the first device 432 is a flip-chip memory chip 432, the second device 434 is an RF wire-bond chip 434, and the subsequent device 452 is a passive device such as an inductor 452. In an embodiment, the subsequent device 452 is a passive device such as a capacitor 452. In an embodiment, the subsequent device 452 is a passive device such as a resistor 452. In an embodiment the subsequent device 452 is integrated passive device (IPD) such a band-pass filter 452. The band-pass filter 452 is coupled to the RF-wirebond chip 434 and is a supporting IPD to the RF-wirebond chip 434 according to an embodiment. In an embodiment, the band-pass filter 452 is located proximate the RF-wirebond chip 434. In an embodiment, "proximate" means there is no device disposed between the band-pass filter 452 and the RF-wirebond chip 434. In an embodiment, the IPD 452 is a low-pass filter. In an embodiment, the IPD 452 is a high pass filter. In an embodiment, the IPD 452 is a diplexer. In an embodiment, the IPD is a balun. It may be understood these devices are connected to an RF device to perform certain RF support functions.

The apparatus 400 also has an overmold layer 436 that protects the at least one device disposed on the second surface 414. The overmold layer 436 delivers multiple effects including at least protection of the at least one device and providing additional stiffness to the entire apparatus 400.

The apparatus 400 has also been processed to include a plurality of electrical bumps 438 disposed on the ball-grid pad array that is illustrated with the ball pads 416.

In an embodiment, the apparatus 400 has also been assembled to a substrate 440 such as a board for a smart phone or a hand-held electronic device. The substrate 440 may be referred to as a foundation substrate 440 that accepts a BBUL-C substrate 410. The land side 412 thus faces the substrate 440. In an embodiment, the electrical bumps 438 are sized to create a standoff 442 such that the embedded die has sufficient clearance so as not to contact the substrate 440. The standoff 442 allows for useful, high-volume production without significant yield loss.

In an embodiment, the standoff 442 allows the backside 422 of the embedded die 218 to seat onto the substrate 440 (not illustrated) such that additional integral stiffness is achieved.

The embedded-die coreless embodiment illustrated provides a HDI design that results in an SiP embodiment. In a example embodiment, the apparatus is a smart phone 400 with most of the processing power assigned to the embedded first die 418. Where the memory caching function may be assigned to the flip-chip 432, and most of the RF duty assigned to the wire-bond chip 434, the subsequent device 452 may be an inductor. In an embodiment an inter-layer metallization 454 is provided in addition to the inter-layer metallization 430 to resist EM emissions emanating significantly from the subsequent device 452.

Figure 5:
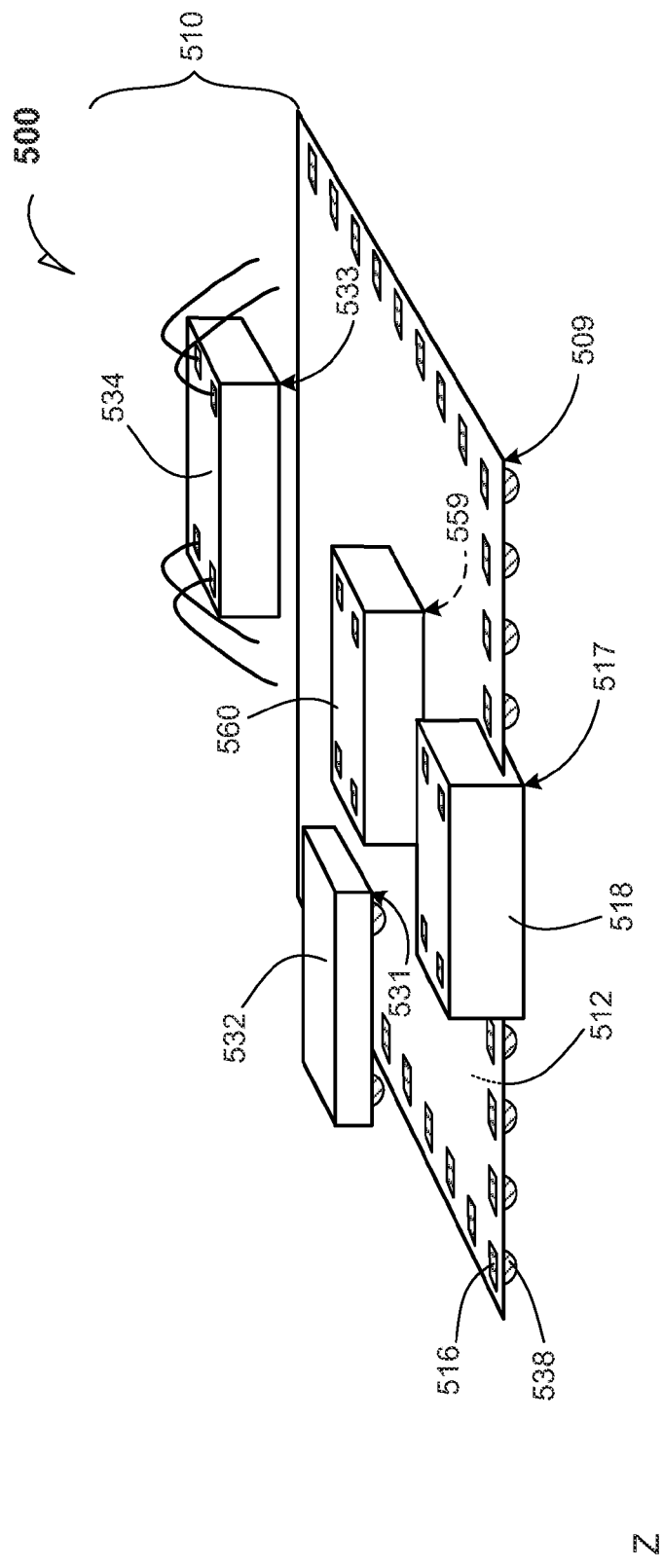
FIG. 5 is a perspective and cut-away schematic elevation of an embedded-die coreless-substrate apparatus according to an example embodiment

FIG. 5 is a perspective and cut-away schematic elevation of an embedded-die coreless-substrate apparatus 500 according to an example embodiment. The space representing a coreless substrate 510 is illustrated rising in the Z-direction. The coreless substrate 510 is illustrated with a land side 512 and a device-mounting side (not pictured). Interlayer dielectric materials and metallizations are not illustrated for clarity of placement of several embedded dice and mounted devices. The land side 512 may also be referred to as a first surface 512 of the coreless substrate 510 and the device-mounting side may also be referred to as a second surface of the coreless substrate 510. An embedded first die 518 and an embedded subsequent die 560 are depicted integral to the coreless substrate 510.

The embedded first die 518 is illustrated such that it is integral to the coreless substrate 510 as well as the embedded subsequent die 560. Each embedded die includes an active surface and a backside surface similarly to other embodiments set forth in this disclosure. In an embodiment at least the backside surface of the embedded first die 518 is exposed through the first surface 512. Manufacture of the embedded-die coreless-substrate apparatus 500 may be done by a BBUL-C process. A ball-grid pad array is located on the land side 512 and a plurality ball pads 516 is illustrated on the first surface 512.

In an embodiment, at least one inter-layer metallization is provided similarly to other illustrated embodiments set forth in this disclosure.

The apparatus 500 also has at least one device disposed on the second surface. In an embodiment, a first device 532 has been flip-chip mounted on the second surface. In an embodiment, a subsequent device 534 has been wire-bonded on the second surface.

In an embodiment, the apparatus 500 also has an overmold layer that protects the at least one device disposed on the second surface. The apparatus 500 has also been processed to include a plurality of electrical bumps 538 disposed on the ball-grid pad array that is illustrated with the ball pads 516.

As illustrated, the coordinate of X is replaced with East (E) and a Y-coordinate is given as North (N). The coreless substrate 510 therefore has a SE corner 509. In an embodiment, the embedded first die 518 has a SE-corner coordinate 517 and the embedded second die 560 has a SE-corner coordinate 559 that are similar in the Z and E dimensions but different in the N dimension. In an embodiment, the first device 532 has a SE-corner coordinate 531 and the subsequent device 534 has a SE-corner coordinate 533 that are similar in the Z dimension but each is different in the N and E dimensions. It may now be understood that a plurality of devices may configured within the Z-profile of an embedded die coreless substrate and they may or may not share similar coordinates.

In an embodiment, the apparatus 500 is assembled to a substrate such as a board for a smart phone or a hand-held electronic device. The land side 512 thus faces the substrate.

The embedded-dice coreless embodiment illustrated provides a HDI design that results in an SiP embodiment. In a example embodiment, the apparatus is a smart phone 500 with most of the processing power assigned to the embedded first die 518. Where the memory caching function may be assigned to the flip-chip 532, and most of the RF duty assigned to the wire-bond chip 534, the embedded subsequent die 560 is a second processor.

Figure 6:
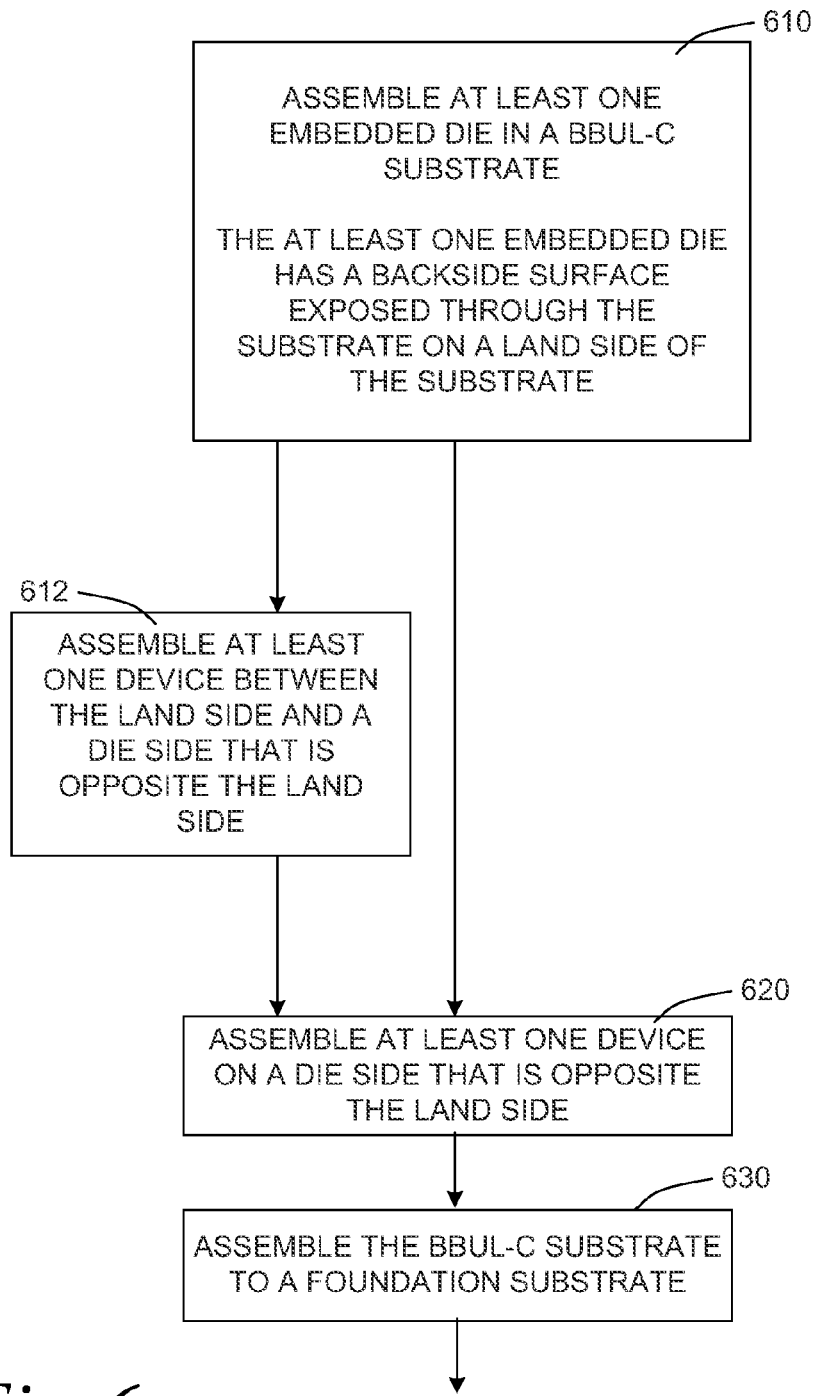
FIG. 6 is a process and method flow diagram according to an example embodiment.

FIG. 6 is a process and method flow diagram 600 according to several embodiments.

At 610, the method includes assembling at least one embedded die in a BBUL-C substrate. In a non-limiting example embodiment, the embedded die 118 is assembled into the coreless substrate 110 as illustrated in FIGS. 1a, 1b, 1c, and 1d. In a non-limiting example embodiment, the embedded first die 218 and the embedded subsequent die 219 are assembled in the coreless substrate 210.

At 612, the method includes assembling at least one embedded die between the land side and the device-mounting side that is opposite the land side. In a non-limiting example embodiment, the embedded first die 318 and the embedded subsequent die 319 are assembled in the coreless substrate 310 with the embedded subsequent die 319 being embedded between the land side 312 and the device-mounting side 314.

At 620, the method includes assembling at least one device on a device-mounting side of the coreless substrate where the device-mounting side is opposite the land side. In a non-limiting example embodiment, the flip-chip 132 and the wire-bond chip 134 are assembled to the device-mounting side of the coreless substrate.

At 630, the method includes assembling the embedded-die, BBUL-C substrate, with at least one device on the device-mounting side, to a foundation substrate. In a non-limiting example embodiment, the BBUL-C substrate 110 is assembled to the foundation substrate 140

Figure 7:
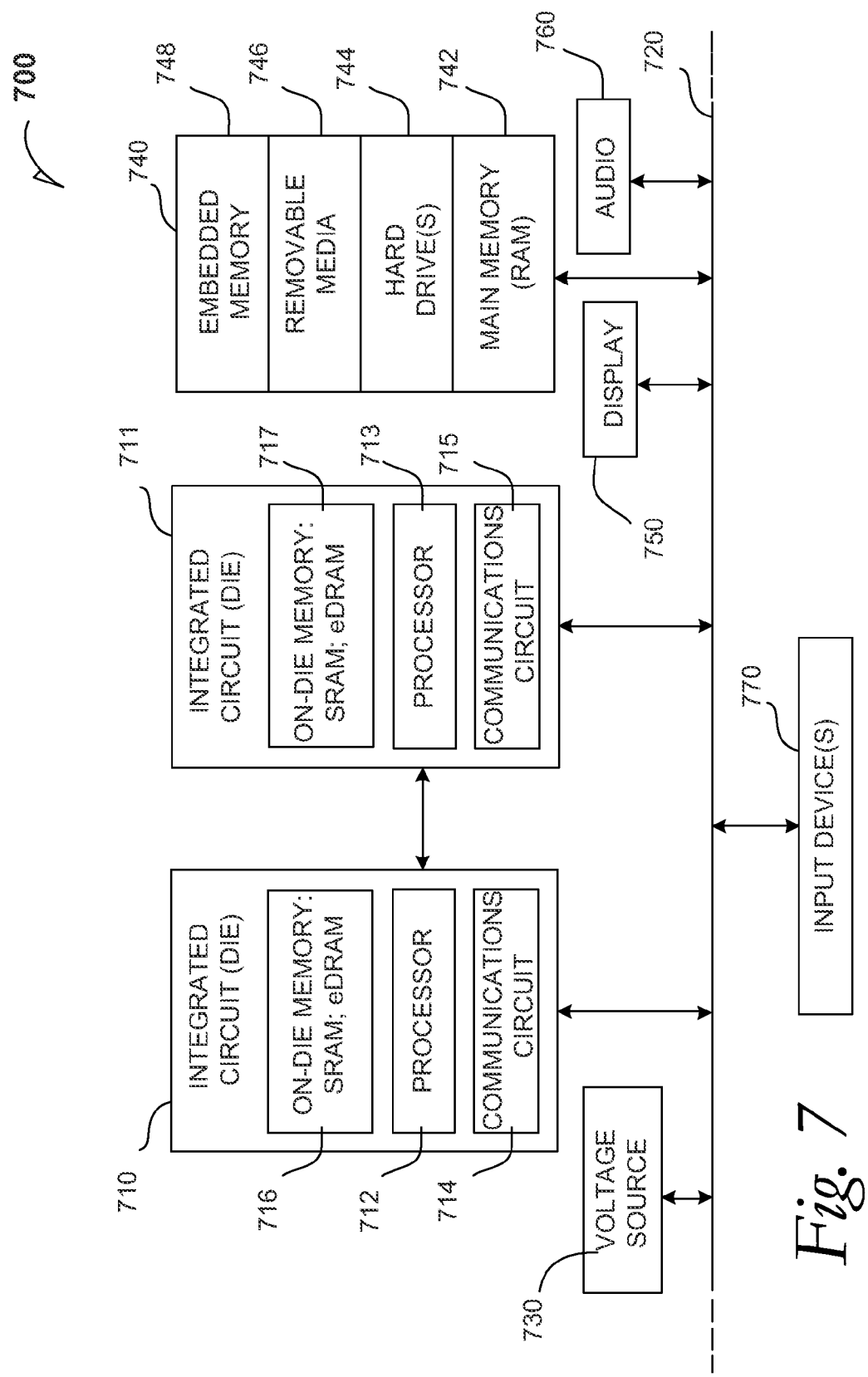
FIG. 7 is a schematic of a computer system according to an embodiment.

FIG. 7 is a schematic of a computer system 700 according to an embodiment. The computer system 700 (also referred to as the electronic system 700) as depicted can embody an embedded-die BBUL-C substrate with at least one device on the surface opposite the land side according to any of the several disclosed embodiments and their equivalents as set forth in this disclosure. The computer system 700 may be a mobile device such as a netbook computer. The computer system 700 may be a mobile device such as a wireless smart phone.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 is the embedded die disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems. In an embodiment, the processor 710 includes on-die memory 716 such as static random-access memory (SRAM). In an embodiment, the processor 710 includes embedded on-die memory 716 such as embedded dynamic random-access memory (eDRAM).

In an embodiment, the integrated circuit 710 is complemented with a subsequent integrated circuit 711 such as an embedded subsequent die embodiment. The dual integrated circuit 711 includes a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as a flip-chip mounted device on the BBUL-C chip side according to an embodiment. In an embodiment, other devices are tied to the integrated circuit 710 such as a wire-bond RF die such as the RF wire-bond die embodiment set forth in this disclosure.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including embedded-die BBUL-C substrate with at least one device on the surface opposite the land side apparatus according to any of the several disclosed embodiments and their equivalents, an electronic system, a computer system, one or more methods of fabricating an integrated circuit, and one or more methods of fabricating an electronic assembly that includes an embedded-die BBUL-C substrate with at least one device on the surface opposite the land side apparatus according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed embedded-die BBUL-C substrate with at least one device on the surface opposite the land side apparatus embodiments and their equivalents.

Although an embedded die may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus, comprising:
a coreless substrate;
a ball-grid pad array disposed on a first surface of the coreless substrate;
a die embedded in and integral to the coreless substrate, wherein the die includes an active surface and a backside surface, and wherein the backside surface is exposed through the first surface;
metallizations that communicate through without contacting a metal shielding plane disposed between the first surface and the second surface;
at least one device disposed on a second surface that is opposite the first surface; and
a foundation substrate electrically connected to the ball-grid pad array through a plurality of electrical bumps, wherein the foundation substrate includes a heat sink embedded therein proximate the die backside surface.

2. The apparatus of claim 1, wherein the metallizations also couple the embedded die to at least one of the first surface and the second surface.

3. The apparatus of claim 1, wherein the plurality of electrical bumps exhibit a first standoff and the backside surface exhibits a second standoff, and wherein the first standoff exceeds the second standoff.

4. The apparatus of claim 1, wherein the at least one device includes a flip chip disposed on the second surface and a wire-bond chip also disposed on the second surface.

5. The apparatus of claim 1, where the die embedded in and integral to the coreless substrate is a first die, the apparatus further including a second die embedded in and integral to the coreless substrate.

6. The apparatus of claim 1, where the die embedded in and integral to the coreless substrate is a first die, the apparatus further including a second die embedded in and integral to the coreless substrate, and wherein the second die and the first die are disposed symmetrically along two dimensions with respect to the first surface.

7. The apparatus of claim 1, where the die embedded in and integral to the coreless substrate is a first die, the apparatus further including a second die embedded in and integral to the coreless substrate, and wherein the second die and the first die have an identical form factor.

8. The apparatus of claim 1, where the die embedded in and integral to the coreless substrate is a first die, the apparatus further including a second die embedded in and integral to the coreless substrate, wherein the second die and the first die have an identical form factor, and wherein the second die and the first die have two identical coordinates and a third non-identical coordinate within the coreless substrate.

9. The apparatus of claim 1, further including electrical connections between the die embedded in and integral to the coreless substrate and the at least one device, and wherein all said electrical connections are disposed internal to the coreless substrate.

10. The apparatus of claim 1, further including an overmold layer that encompasses the at least one device.

11. The apparatus of claim 1, wherein the at least one device includes a passive device selected from a resistor, a capacitor, a low-pass filter a high pass filter, a diplexer, a balun, and an inductor.

12. The apparatus of claim 1, wherein the at least one device includes a band-pass filter coupled to a radio-frequency device.

13. The apparatus of claim 1, wherein the at least one device includes a band-pass filter disposed proximate to and coupled to a radio-frequency device.

14. An apparatus, comprising:
a coreless substrate;
a ball-grid pad array disposed on a first surface of the coreless substrate;
a die embedded in and integral to the coreless substrate, wherein the die includes an active surface and a backside surface, and wherein the backside surface is exposed through the first surface;
metallizations that communicate through without contacting a metal shielding plane disposed between the first surface and the second surface;
a flip-chip disposed on a second surface that is opposite the first surface;
a wire-bond chip disposed on the second surface;
electrical connections formed by the metallizations between the die embedded in and integral to the coreless substrate and the flip-chip and wire-bond chip, and wherein all said electrical connections are disposed internal to the coreless substrate; and
a substrate electrically connected to the ball-grid pad array through a plurality of electrical bumps, wherein the substrate includes a heat sink embedded therein proximate the die backside surface.

15. The apparatus of claim 14, wherein the ball-grid pad array includes a plurality of electrical bumps, wherein the plurality of electrical bumps exhibit a first standoff and the backside surface exhibits a second standoff, and wherein the first standoff exceeds the second standoff.

16. The apparatus of claim 14, wherein the metallizations also couple the embedded die to at least one of the first surface and the second surface.

17. The apparatus of claim 14, where the die embedded in and integral to the coreless substrate is a first die, the apparatus further including a second die embedded in and integral to the coreless substrate.

18. The apparatus of claim 14, wherein the at least one device includes a passive device selected from a resistor, a capacitor, a low-pass filter, a high pass filter, a diplexer, a balun, and an inductor.

19. The apparatus of claim 14, wherein the at least one device includes a band-pass filter coupled to a radio-frequency device.

20. The apparatus of claim 14, wherein the at least one device includes a band-pass filter disposed proximate to and coupled to a radio-frequency device.

21. A method comprising:
assembling at least one embedded die into a coreless, bumpless build-up layer (BBUL-C) substrate, wherein the BBUL-C substrate has a land side and a device-mounting side opposite the land side and metallizations that communicate through without contacting a metal shielding plane disposed between the land side and the device-mounting side, wherein the embedded die has an active surface and a backside surface, and wherein the embedded die backside surface is exposed through the land side;
assembling at least one device on the device-mounting side; and
coupling the embedded die to the at least one device woth the metallizations, wherein coupling is routed internally to the BBUL-C substrate; and
assembling the BBUL-C substrate to a foundation substrate, wherein the foundation substrate includes a heat sink embedded therein proximate the embedded die backside surface.

22. The method of claim 21, wherein the embedded die is an embedded first die, the method further including assembling an embedded subsequent die into the BBUL-C substrate.

23. The method of claim 21, wherein the embedded die is an embedded first die, the method further including:
assembling an embedded subsequent die into the BBUL-C substrate, and wherein the embedded subsequent die is assembled entirely internally into the BBUL-C substrate.

24. The method of claim 21, wherein assembling at least one device on the device-mounting substrate includes mounting a flip-chip thereupon.

25. The method of claim 21, wherein assembling at least one device on the device-mounting substrate includes mounting a wire-bond chip thereupon.

26. The method of claim 21, wherein assembling at least one device on the device-mounting substrate includes mounting a passive device thereupon.

27. The method of claim 21, wherein assembling at least one device on the device-mounting substrate includes assembling a band-pass filter that is coupled to a radio-frequency device.

28. The method of claim 21, wherein assembling at least one device on the device-mounting substrate includes assembling a band-pass filter that is coupled to and proximate to a radio-frequency device.

29. The method of claim 21, wherein assembling at least one device on the device-mounting substrate includes mounting at least two of a flip-chip, a wire-bond chip, and a passive device thereupon.

30. The method of claim 21, wherein assembling at least one device on the device-mounting substrate includes mounting at least two of a flip-chip, a wire-bond chip, and a passive device thereupon, the method further including assembling the BBUL-C substrate to a foundation substrate.

31. A computing system, comprising:
a coreless substrate;
a ball-grid array disposed on a first surface of the coreless substrate;
a die embedded in and integral to the coreless substrate, wherein the die includes an active surface and a backside surface, and wherein the backside surface is exposed through the first surface;
at least one device disposed on a second surface that is opposite the first surface;
metallizations that communicate through without contacting a metal shielding plane disposed between the first surface and the second surface;
a foundation substrate coupled to the coreless substrate, wherein the foundation substrate includes a heat sink embedded therein proximate the die backside surface.

32. The computing system of claim 31, wherein the at least one device includes a band-pass filter disposed proximate to and coupled to a radio-frequency device.

33. The computing system of claim 31, further including external memory coupled to the embedded die.

34. The computing system of claim 31, wherein the computing system is part of one of a cellular telephone, a pager, a portable computer, a desktop computer, and a two-way radio.

* * * * *